(12) United States Patent
Park

(10) Patent No.: US 8,581,397 B2
(45) Date of Patent: Nov. 12, 2013

(54) SUBSTRATE FOR SEMICONDUCTOR PACKAGE WITH IMPROVED BUMPING OF CHIP BUMPS AND CONTACT PADS AND SEMICONDUCTOR PACKAGE HAVING THE SAME

(75) Inventor: Myung Geun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 435 days.

(21) Appl. No.: 12/059,141

(22) Filed: Mar. 31, 2008

(65) Prior Publication Data

US 2009/0140422 A1 Jun. 4, 2009

(30) Foreign Application Priority Data

Nov. 30, 2007 (KR) .................. 10-2007-0123766

(51) Int. Cl.
*H01L 23/48* (2006.01)
(52) U.S. Cl.
USPC .......................................... 257/734; 257/737
(58) Field of Classification Search
USPC ..................... 257/734, 737, E23.01
See application file for complete search history.

(56) References Cited

U.S. PATENT DOCUMENTS

| 7,004,644 | B1 | 2/2006 | Johnson |
| 7,070,207 | B2 | 7/2006 | Asai |
| 7,783,141 | B2 * | 8/2010 | Kodama et al. ................. 385/14 |
| 2005/0064627 | A1 * | 3/2005 | Kimura et al. ................. 438/107 |
| 2005/0218513 | A1 * | 10/2005 | Seko ............................. 257/734 |
| 2006/0045434 | A1 | 3/2006 | Numata et al. |
| 2006/0055032 | A1 * | 3/2006 | Chang et al. .................. 257/734 |
| 2006/0159405 | A1 | 7/2006 | Yajima |
| 2006/0263003 | A1 | 11/2006 | Asai et al. |
| 2007/0069378 | A1 | 3/2007 | Park et al. |
| 2007/0104412 | A1 | 5/2007 | Hsu |
| 2007/0164447 | A1 | 7/2007 | Ho et al. |

FOREIGN PATENT DOCUMENTS

| JP | 10-190203 A | 7/1998 |
| JP | 2000-077562 A | 3/2000 |
| JP | 2002-134559 A | 5/2002 |
| JP | 2003-218542 A | 7/2003 |
| JP | 2004-221371 A | 8/2004 |
| JP | 2006-049477 A | 2/2006 |
| KR | 1020020042033 A | 6/2002 |

* cited by examiner

*Primary Examiner* — Tran Tran
(74) *Attorney, Agent, or Firm* — Ladas & Parry LLP

(57) ABSTRACT

The present invention relates to a substrate for a semiconductor package and a semiconductor package having the same. A substrate for a semiconductor package includes a substrate body; a contact pad group including a plurality of contact pads parallely arranged at a determined interval on a surface of the substrate body; dummy contact pads arranged at both sides of the contact pad group, respectively; and solder resist patterns covering the substrate body and having openings exposing the dummy contact pads and the contact pad group. When bumping the semiconductor chip having the bumps to the solders arranged on the contact pads formed on the substrate, the bumping defect caused due to different volumes of each solder can be prevented.

18 Claims, 2 Drawing Sheets

SUBSTRATE FOR SEMICONDUCTOR PACKAGE WITH IMPROVED BUMPING OF CHIP BUMPS AND CONTACT PADS AND SEMICONDUCTOR PACKAGE HAVING THE SAME

CROSS-REFERENCE TO RELATED APPLICATIONS

The present application claims priority to Korean patent application number 10-2007-0123766 filed on Nov. 30, 2007, which is incorporated herein by reference in its entirety.

BACKGROUND OF THE INVENTION

The present invention relates to a substrate for a semiconductor package and a semiconductor package having the same, and more particularly to a substrate for a semiconductor package that prevents defects that may arise due to positioning error of a solder pattern opening that exposes contact pads.

With advancement of the semiconductor manufacturing technologies, semiconductor packages having semiconductor devices suitable for processing more data in a less time have been studied for development.

Generally, the semiconductor package manufacturing processes include a semiconductor chip manufacturing process for manufacturing semiconductor chips on a high-purity silicon wafer, a die sorting process for checking the semiconductor chips for their electrical integrity, a packaging process for packaging the sorted semiconductor chips, and others.

A chip scale package of recent development targets for a package size that is, for example, only 100% to 105% of the size of chip packaged therein.

One type of the chip scale package is known as a flip chip semiconductor package that reduces the package size by electrically connecting a bump in the semiconductor chip directly to a contact pad in the substrate without using a lead frame.

High integration of a semiconductor chip means much increased number of bumps formed on the chip and therefore a closer interval between the bumps formed on the semiconductor chip.

According to one conventional technique, a plurality of contact pads having micro pitches are arranged on a substrate in a parallel manner, and a solder resist film is formed to cover the plurality of the contact pads. Then, the solder resist film is patterned to form one opening that exposes the plurality of contact pads all together, and a solder paste film covering the contact pads is formed in the opening. After covering the solder paste film in the opening, the solder paste film is melted in order to take advantage of the phenomenon of the solder gathering towards and to be collected at each contact pad, and as such the solder patterns are formed on the contact pads having the micro pitches.

However, when the solder patterns are formed by the aforementioned technique, a problem lies in that the volume of each of the solder patterns formed on the contact pads that are arranged on the outermost part of the substrate is different from the volume of each of the solder patterns formed on the contact pads that are arranged on the non-outermost part of the substrate.

This problem is known to occur due to the errors in the position of the opening being formed by patterning the solder resist film.

Of course, one could propose to better control the position of the opening on the solder resist film in order to control the volume of each solder on each of the contact pads arranged on the outermost part of the substrate.

However, unavoidable positional errors will most likely (if not inevitably) occur when forming the opening by patterning the solder resist film, as such it would be difficult to precisely control the volume of each of the solder patterns of the contact pads arranged on the outermost part of the substrate. This causes defects when bumping the chip bumps to the contact pads.

SUMMARY OF THE INVENTION

Embodiments of the present invention are directed to a substrate for a semiconductor package capable of preventing a formation defect of solder patterns arranged on outermost contact pads among contact pads electrically connected to bumps of a semiconductor chip.

Embodiments of the present invention are directed to a semiconductor package having a substrate for the semiconductor package.

In one embodiment, a substrate for a semiconductor package according to the present invention comprises: a substrate body; a contact pad group including a plurality of contact pads on a surface of the substrate body; dummy contact pads arranged at both sides of the contact pad group, respectively; and solder resist patterns covering the substrate body and having openings exposing the dummy contact pads and the contact pad group.

In the substrate for the semiconductor package, on the contact pads are arranged solder patterns and on the dummy contact pads are arranged dummy solder patterns.

In the substrate for the semiconductor package, the solder patterns have a uniform first volume and the dummy solder patterns have a second volume different from the first volume.

In the substrate for the semiconductor package, the neighboring contact pads and the dummy contact pads adjacently arranged to the contact pads are spaced at the same interval.

In the substrate for the semiconductor package, the dummy contact pads and the contact pads have substantially the same size.

In another embodiment, a semiconductor package according to the present invention comprises: a substrate including a substrate body, a contact pad group including a plurality of contact pads parallely arranged at a specified interval on a surface of the substrate body, solder resist patterns having dummy contact pads adjacently arranged to the contact pads and openings exposing the dummy contact pads and the contact pad group; solder patterns arranged on the respective contact pads; dummy solder patterns arranged on the respective dummy contact pads; and bumps electrically connected to the solder patterns.

In the semiconductor package, the neighboring contact pads and the dummy contact pads adjacent to the contact pads are arranged at the same interval.

In the semiconductor package, the neighboring contact pads and the dummy contact pads adjacent to the contact pads are arranged at different intervals.

In the semiconductor package, each solder pattern has a first volume and each dummy solder pattern has a second volume In the semiconductor package, each solder pattern and each dummy solder pattern have the same volume.

In the semiconductor package, the contact pad and the dummy contact pad have substantially the same size.

DESCRIPTION OF SPECIFIC EMBODIMENTS

Figure 1:
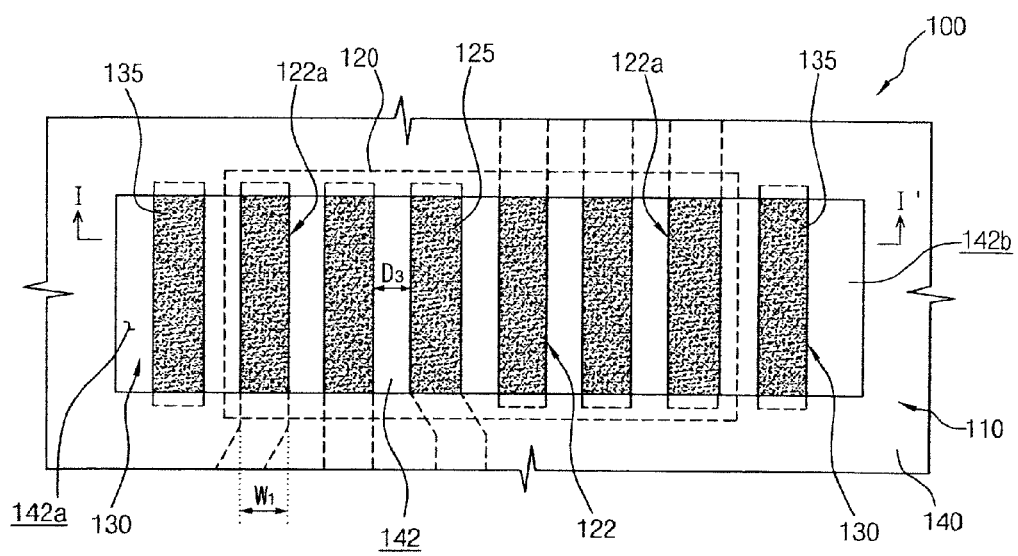
FIG. 1 is a plan view showing a substrate for a semiconductor package according to an embodiment of the present invention.
Figure 2:
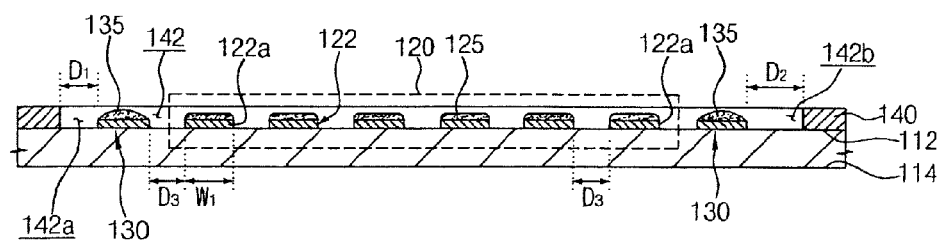
FIG. 2 is a cross-sectional view taken along line I-I' of FIG. 1.

FIG. 1 is a plan view showing a substrate for a semiconductor package according to an embodiment of the present invention. FIG. 2 is a cross-sectional view taken along line I-I' of FIG. 1.

Referring to FIGS. 1 and 2, a substrate for a semiconductor package includes a substrate body 110, a contact pad group 120, a dummy contact pads 130, and solder resist patterns 140.

The substrate body 110, for example, may be a planar printed circuit board (or having a "plate shape").

The substrate body 110 having the plate shape includes a first surface 112 and a second surface 114 opposing the first surface 112.

The contact pad group 120 is arranged on the first surface 112 of the substrate body 110 and includes a plurality of contact pads 122. The plurality of contact pads 122 may be parallely arranged on the first surface 112 and each contact pad 122 has a bar shape as shown in FIG. 1.

Each contact pad 122 of the contact pad group 120 may be electrically connected to ball lands (not shown) formed on the second surface 114 opposing the first surface 112 of the substrate body 110. Solder balls (not shown) are formed on the ball lands so as to electrically connect to each other.

The contact pads 122 of the contact pad group 120 are spaced from each other at a same interval D3, and the contact pads 122 that are spaced at the interval D3 are of the same size. For example, the contact pads 122 are spaced from each other at the same interval D3 and each contact pad 122 has the same width W1.

Figure 3:
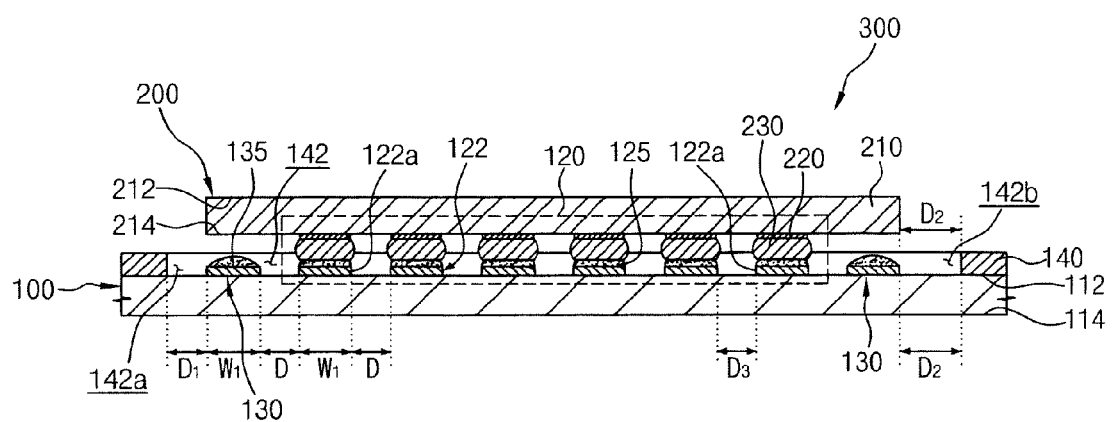
FIG. 3 is a cross-sectional view showing a semiconductor package according to an embodiment of the present invention.

The dummy contact pads 130 are arranged on the first surface 112 of the substrate body 110. A number of dummy contact pad 130 is arranged at each side of the contact pad group 120 as shown in FIGS. 1 to 3 according to which one dummy contact pad 130 is formed on either side of the contact pad group 120. However, it is also possible that a number of dummy contact pads 130 may be arranged between any the contact pads 122 in the contact pad group 120.

The dummy contact pads 130 are arranged on the first surface 112 of the substrate body 110 as islands. In other words, the dummy contact pads 130 are not electrically connected to the ball lands (not shown) or the contact pads 122 in FIGS. 1-3. Nevertheless, it is also possible according to an embodiment of the present invention that the dummy contact pads 130 could be electrically connected to the ball lands (not shown) or the contact pads 122.

Each dummy contact pad 130 arranged on either side of the contact pad group 120 is spaced from the outermost contact pads 122a of the contact pad group 120 at the same interval D3, which is the interval between two adjacent contacts 122 in the contact pad group 120 as discussed above. The dummy contact pad 130 may have the same shape as each contact pad 122. For example, each dummy contact pad 130 could be formed to have the width W, which is same as the width of the contact pad 122. However, it is also possible that a dummy contact pad 130 may be formed to have a different shape or width than the contact pad 122.

The solder resist pattern 140 is formed on the first surface 112 of the substrate body 110 to have an opening 142 through which the contact pads 122 and the dummy contact pads 130 are exposed. As discussed above, formed on the first surface 112 of the substrate body 110 are the contact pad group 120 having the contact pads 122 and the dummy contact pad 130.

The location of the opening 142 with respect to the solder resist pattern 140 may vary due to certain process deviations that may be particular to the equipment being used to form the opening 142 on the solder resist pattern 140. For this reason, the areas 142a, 142b that are two parts of the opening 142 outside the contact pad group 120 may not be the same. Each dummy contact pad 130 is arranged in each of the areas 142a, 142b.

For example, the area 142a on left of the contact pad group 120 as shown in FIG. 1 could be formed in a smaller size than the area 142b on right of the contact pad group 120.

Referring back to FIGS. 1 and 2, the solder patterns 125 are arranged on the contact pads 122, and the dummy solder patterns 135 are arranged on the dummy contact pads 130.

Each solder pattern 125 is formed on the contact pad 122 to have a first volume that is substantially same for all solder patterns 125.

In an embodiment of the present embodiment, the reason for forming the solder patterns 125 to have the same first volume on the contact pads 122 is because the dummy contact pads 130 are arranged on the sides of the contact pad group 120.

Because the sizes of the areas 142a, 142b in which the dummy contact pads 130 are arranged outside the contact pad group 120 are different, the dummy solder patterns 135 formed on the dummy contact pads 130 have a second volume that is different from the first volume. Also, the volumes of the dummy solder patterns 135 arranged on the sides of the contact pad group 120 may also be different. However, it is also possible that all the dummy solder patterns 135 could be formed to have a same volume such as the first volume.

In an embodiment of the present embodiment, since the portions electrically connected to the bumps of the semiconductor chip are the contact pads 122 and since the dummy contact pads 130 are not electrically connected to the bumps of the semiconductor chip, the bump connection defects of the semiconductor chip does not occur even if the volumes of the dummy solder patterns 135 on the dummy contact pads 130 are different.

FIG. 3 is a cross-sectional view showing the semiconductor package according to an embodiment of the present invention.

Referring to FIG. 3, a semiconductor package 300 includes a substrate 100 and a semiconductor chip 200.

The substrate 100 includes a substrate body 110. For example, the substrate body 110 may be a planar printed circuit board (PCB). The planar substrate body 110 includes the first surface 112 and the second surface 114 on the other side of the first surface 112.

The contact pad group 120 is arranged on the first surface 112 of the substrate body 110. The contact pad group 120 includes the plurality of contact pads 122. The plurality of contact pads 122 may be parallely arranged on the first surface 112.

Each contact pad 122 in the contact pad group 120 can be electrically connected to the ball lands (not shown) that are formed on the second surface 114 of the substrate body 110. The solder balls (not shown) may be formed on the ball lands so as to be electrically connected to each other.

For example, the contact pads 122 in the contact pad group 120 are uniformly spaced at a uniform interval D3, and the contact pads that are spaced at the D3 interval apart have the same size. For example, each contact pad 122 may be formed to have a same width W1.

A number of dummy contact pads 130 are arranged on the first surface 112 of the substrate body 110 on either side of the contact pad group 120. For example, one dummy contact pad 130 may be arranged at each side of the contact pad group 120 as shown in FIG. 3.

Each dummy contact pad 130 is arranged as an island on the first surface 112 of the substrate body 110, such that the dummy contact pads 130 are not electrically connected to, for example, the ball lands or the contact pads 122. However, it is still possible that the dummy contact pads 130 may be formed to electrically connect to the ball land or the contact pads 122.

Each dummy contact pad 130 arranged at each side of the contact pad group 120 is spaced at the same interval D3 from the corresponding one of the outermost contact pads 122a in the contact pad group 120. The dummy contact pad 130 may be formed to have the same shape as a contact pad 122. For example, each dummy contact pad 130 may be formed to have the width W of the contact pads 122.

The solder resist pattern 140 having an opening 142 through which the contact pads 122 and the dummy contact pads 130 are exposed is formed on the first surface 112 of the substrate body 110. The contact pad group 120 having the contact pads 122 and the dummy contact pad 130 are also formed on the first surface 112 of the substrate body 110.

The location of the opening 142 with respect to the solder resist pattern 140 may vary due to certain process deviations that may be particular to the equipment being used to form the opening 142 on the solder resist pattern 140. For this reason, the areas 142a, 142b that are two parts of the opening 142 outside the contact pad group 120 may not be the same. Each dummy contact pad 130 is arranged in each of the areas 142a, 142b. For example, the area 142a on left of the contact pad group 120 as shown in FIG. 1 could be formed in a smaller size than the area 142b on right of the contact pad group 120.

Each solder pattern 125 is formed on the contact pad 122, and the dummy solder patterns 135 is formed on each of the dummy contact pads 130.

Each solder pattern 125 is formed on the contact pad 122 to have a first volume that is substantially same for all solder patterns 125. In an embodiment of the present embodiment, the reason for forming the the solder patterns 125 to have the same first volume on the contact pad 122 is because the dummy contact pads 130 are arranged on the sides of the contact pad group 120.

Because the size of the areas 142a, 142b in which the dummy contact pads 130 are arranged outside the contact pad group 120 are different, the dummy solder patterns 135 formed on the dummy contact pads 130 have a second volume that is different from the first volume. Also, the volumes of the dummy solder patterns 135 arranged on the sides of the contact pad group 120 may also be different.

The semiconductor chip 200 has a semiconductor chip body 210. The semiconductor chip body 210 has a rectangular parallelepiped shape (e.g., a boxy same having six surfaces) and includes an upper surface 212 and a lower surface 214 as shown in FIG. 3.

Bonding pads 220 are arranged on the lower surface 214 of the semiconductor chip 200. In an embodiment of the present embodiment, the positions of the bonding pads 220 are formed to correspond to the contact pads 122 of the contact pad group 120 on the substrate 100.

The bumps 230 which could be made of solder or gold are arranged on the bonding pads 220. In an embodiment of the present embodiment, the bumps 230 are electrically connected in a selective manner to the contact pads 122 in the contact pad group 120 of the substrate 100. Since the volume and shape of all solder patterns 125 arranged on the contact pads 122 are uniform, the bumping defect caused due to differences in the shape and volume of the solder patterns 125 when the bump 230 and the solder patterns 125 are connected to can be prevented.

As discussed above, the bumping defect caused due to the different volumes of each solder can be prevented when bumping the semiconductor chip having the bumps to the contact pads formed on the substrate.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a substrate comprising:
      a substrate body;
      a contact pad group having a plurality of contact pads arranged in parallel at a determined interval between two adjacent contact pads on a surface of the substrate body,
      dummy pads arranged at both sides of the contact pad group on the same surface of the substrate body and disposed to be electrically isolated from the contact pad group as islands; and
      a solder resist pattern having one or more openings formed on the same surface of the substrate body to expose the plurality of contact pads and the dummy pads;
   solder patterns formed on the contact pads;
   dummy solder patterns formed on the dummy pads; and
   a semiconductor chip comprising bumps electrically connected to the solder patterns and the contact pads of the contact pad group, the dummy solder patterns being electrically isolated from the semiconductor chip,
   wherein, the semiconductor chip, which comprised bumps electrically connected to the solder patterns and the contact pads of the contact pad group, overlaps the dummy pads arranged at both sides of the contact pad group.

2. The semiconductor package according to claim 1, wherein an interval between the dummy pad and the contact pad that is adjacent to the dummy pad is substantially identical to the determined interval.

3. The semiconductor package according to claim 1, wherein an interval between the dummy pad and the contact pad that is adjacent the dummy pad is different from the determined interval.

4. The semiconductor package according to claim 1, wherein each solder pattern has a first volume and each dummy solder pattern has a second volume different from the first volume.

5. The semiconductor package according to claim 1, wherein each solder pattern and each dummy solder pattern have substantially the same volume.

6. A substrate for a semiconductor package comprising:
   a substrate body;
   a contact pad group comprising a plurality of contact pads formed on a surface of the substrate body;
   dummy pads formed at both sides of the contact pad group on the same surface of the substrate body and disposed to be electrically isolated from the contact pad group as islands; and
   a solder resist pattern surrounding the contact pad group and the dummy pads and having a single opening formed on the same surface of the substrate body in which each of the dummy pads and the contact pad group are disposed, wherein the dummy pads include:
a first dummy pad formed in a first part of the opening that is outside the contact pad group at a first side of the contact pad group, and
a second dummy pad formed in a second part of the opening that is outside the contact pad group at a second side of the contact pad group, and
wherein the first part and the second part have different sizes.

7. The substrate according to claim 6, wherein each of the contact pads comprises solder patterns, and wherein each of the dummy pads comprises dummy solder patterns.

8. The substrate according to claim 7, wherein each solder pattern is formed to a first volume such that the volumes for the solder patterns are substantially same and wherein each dummy solder pattern is formed to a second volume that is different from the first volume of the solder patterns.

9. The substrate according to claim 7, wherein the first volume of the solder pattern is substantially identical to the second volume of the dummy solder pattern.

10. The substrate according to claim 7, wherein the contact pads of the contact pad group are arranged in parallel with each other and two adjacent contact pads have a determined interval.

11. The substrate according to claim 10, wherein the determined interval is present between any two neighboring contact pads or between the dummy pad and the adjacently arranged contact pad.

12. The substrate according to claim 7, wherein the contact pad and the dummy pad have substantially the same size.

13. A substrate for a semiconductor package comprising:
a substrate body;
a contact pad group comprising a plurality of contact pads formed on a surface of the substrate body;
one or more first dummy pads formed at a first side of the contact pad group and one or more second dummy pads formed at a second side opposing the first side of the contact pad group, wherein the one or more first and one or more second dummy pads are formed on the same surface of the substrate body and disposed to be electrically isolated from the contact pad group as islands; and
wherein the interval between the one or more first dummy pads and the adjacent contact pad of the contact pad group and the interval between the one or more second dummy pads and the adjacent contact pad of the contact pad group is the same as the interval between any two adjacent contact pads of the contact pad group,
a solder resist pattern having an opening formed on the same surface of the substrate body to expose the dummy pads and the contact pad group,
wherein the one or more first dummy pads are formed in a first part of the opening that is outside the contact pad group at the first side,
wherein the one or more second dummy pads are formed in a second part of the opening that is outside the contact pad group, and
the first part and the second part have different sizes.

14. The substrate according to claim 13, wherein each of the contact pads comprises solder patterns, and wherein each of the dummy pads comprises dummy solder patterns.

15. The substrate according to claim 14, wherein each solder pattern is formed to a first volume such that the volumes for the solder patterns are substantially same and wherein each dummy solder pattern is formed to a second volume that is different from the first volume.

16. The substrate according to claim 14, wherein the first volume of the solder pattern is substantially identical to the second volume of the dummy solder pattern.

17. The substrate according to claim 13, wherein the contact pads of the contact pad group are arranged in parallel with each other and two adjacent contact pads have a determined interval.

18. The substrate according to claim 13, wherein the contact pad and the dummy pad have substantially the same size.

* * * * *